(12) United States Patent
Jung

(10) Patent No.: US 10,083,837 B2
(45) Date of Patent: Sep. 25, 2018

(54) METHODS OF FORMING PATTERNS USING IMPRINT PROCESS

(71) Applicant: SK hynix Inc., Gyeonggi-do (KR)

(72) Inventor: Woo Yung Jung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/464,700

(22) Filed: Mar. 21, 2017

(65) Prior Publication Data

US 2018/0144944 A1    May 24, 2018

(30) Foreign Application Priority Data

Nov. 23, 2016 (KR) .................. 10-2016-0156846

(51) Int. Cl.
  *H01L 21/308* (2006.01)
  *H01L 21/3065* (2006.01)
  *H01L 21/311* (2006.01)

(52) U.S. Cl.
  CPC ...... *H01L 21/3065* (2013.01); *H01L 21/3083* (2013.01); *H01L 21/30655* (2013.01); *H01L 21/31144* (2013.01)

(58) Field of Classification Search
  CPC ......... H01L 21/30655; H01L 21/31055; H01L 21/31111; H01L 21/31144; H01L 21/312; H01L 21/308; H01L 21/3065; H01L 21/02318; H01L 21/31056; H01L 21/30604; H01L 21/02057; H01L 21/3083

USPC ....... 438/706, 714, 717, 719, 723, 736, 693, 438/694; 430/323, 325
  See application file for complete search history.

(56) References Cited

U.S. PATENT DOCUMENTS

| | | | |
|---|---|---|---|
| 7,335,456 B2 | 2/2008 | Li et al. | |
| 2007/0037410 A1* | 2/2007 | Chang | G03F 7/40 438/780 |
| 2010/0068656 A1* | 3/2010 | Yeh | G03F 7/0035 430/323 |
| 2012/0028195 A1* | 2/2012 | Wu | C09D 183/08 430/323 |
| 2014/0235070 A1* | 8/2014 | Bassett | H01L 21/6715 438/782 |
| 2015/0044417 A1* | 2/2015 | Koike | G03F 7/0002 428/137 |

FOREIGN PATENT DOCUMENTS

| | | |
|---|---|---|
| KR | 1020130130090 | 11/2013 |
| KR | 1020160045058 | 4/2016 |

* cited by examiner

*Primary Examiner* — Lan Vinh
(74) *Attorney, Agent, or Firm* — IP & T Group LLP

(57) ABSTRACT

A method for forming patterns is provided. The method includes forming a resist layer on a substrate, imprinting a convex pattern and a concave pattern on the resist layer using a template, forming a silicon diffusion layer containing silicon containing diffusion species in an upper portion of the convex pattern, and selectively removing a recessed portion of the resist layer under the concave pattern using the silicon diffusion layer as an etch mask.

19 Claims, 7 Drawing Sheets

METHODS OF FORMING PATTERNS USING IMPRINT PROCESS

CROSS-REFERENCE TO RELATED APPLICATIONS

The present application claims priority under 35 U.S.C 119(a) to Korean Application No. 10-2016-0156846, filed on Nov. 23, 2016, which is incorporated herein by reference in its entirety.

BACKGROUND

1. Technical Field

Various embodiments of the present disclosure relate to methods for forming patterns and, more particularly, to methods for forming patterns using an imprint process.

2. Related Art

An imprint process may typically utilize a nano-imprint lithography (NIL) technique for transferring pattern images of nano-scale structures. The NIL technique may be used in processes for fabricating various semiconductor devices. The NIL technique is an attractive candidate of advanced lithography processes for fabricating large scale integrated circuits (LSIs), for example, semiconductor devices, liquid crystal display (LCD) devices, image sensor devices, magnetic heads, or the like. The NIL technique may be applied to an imprint layer or an imprintable medium which is formed on any one of various substrates such as a silicon wafer and a glass plate.

According to the NIL technique, a template having a concavo-convex shape or inverted patterns for desired patterns may contact an imprint layer, and the template may be pressed down into the imprint layer to transfer images of the patterns of the template into the imprint layer. Each of the patterns defined by the concavo-convex shape of the template may have a width of about a few nanometers to about several tens of nanometers.

The imprint layer may have a thickness which is greater than a depth or a height of the patterns transferred into the imprint layer. Thus, the imprinted patterns in the imprint layer may correspond to carved patterns that do not penetrate the imprint layer. Accordingly, it may be necessary to additionally extend the carved or imprinted patterns that is, concave patterns into the imprint layer so that the carved or imprinted patterns completely penetrate the imprint layer.

A process for extending the carved patterns into the imprint layer may include etching residual portions of the imprinted layer, which remain under the carved patterns. However, during the etch process for removing the residual portions of the imprinted layer, an entire portion of the imprinted layer may be etched due to an etch rate of the residual portions of the imprinted layer being substantially equal to an etch rate of protruding portions that is, convex patterns between the carved patterns. As a result, it may be difficult to obtain accurate and clear fine patterns in the imprinted layer. Thus, a lot of effort has been focused on modifying or developing the NIL technique in order to more accurately control sizes or widths of the imprinted patterns.

SUMMARY

According to an embodiment, there is provided a method for forming patterns. The method includes forming a resist layer on a substrate, imprinting a convex pattern and a concave pattern on the resist layer using a template, forming a buffer layer on the resist layer to fill the concave pattern, forming a silicon source layer on the buffer layer, diffusing silicon containing diffusion species in the silicon source layer into an upper portion of the convex pattern to form a silicon diffusion layer, selectively removing the silicon source layer and the buffer layer, and selectively removing a recessed portion of the resist layer under the concave pattern using the silicon diffusion layer as an etch mask.

According to another embodiment, there is provided a method for forming patterns. The method includes forming a resist layer on a substrate, imprinting a convex pattern and a concave pattern on the resist layer using a template, forming a silicon diffusion layer containing silicon containing diffusion species in an upper portion of the convex pattern, and selectively removing a recessed portion of the resist layer under the concave pattern using the silicon diffusion layer as an etch mask.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
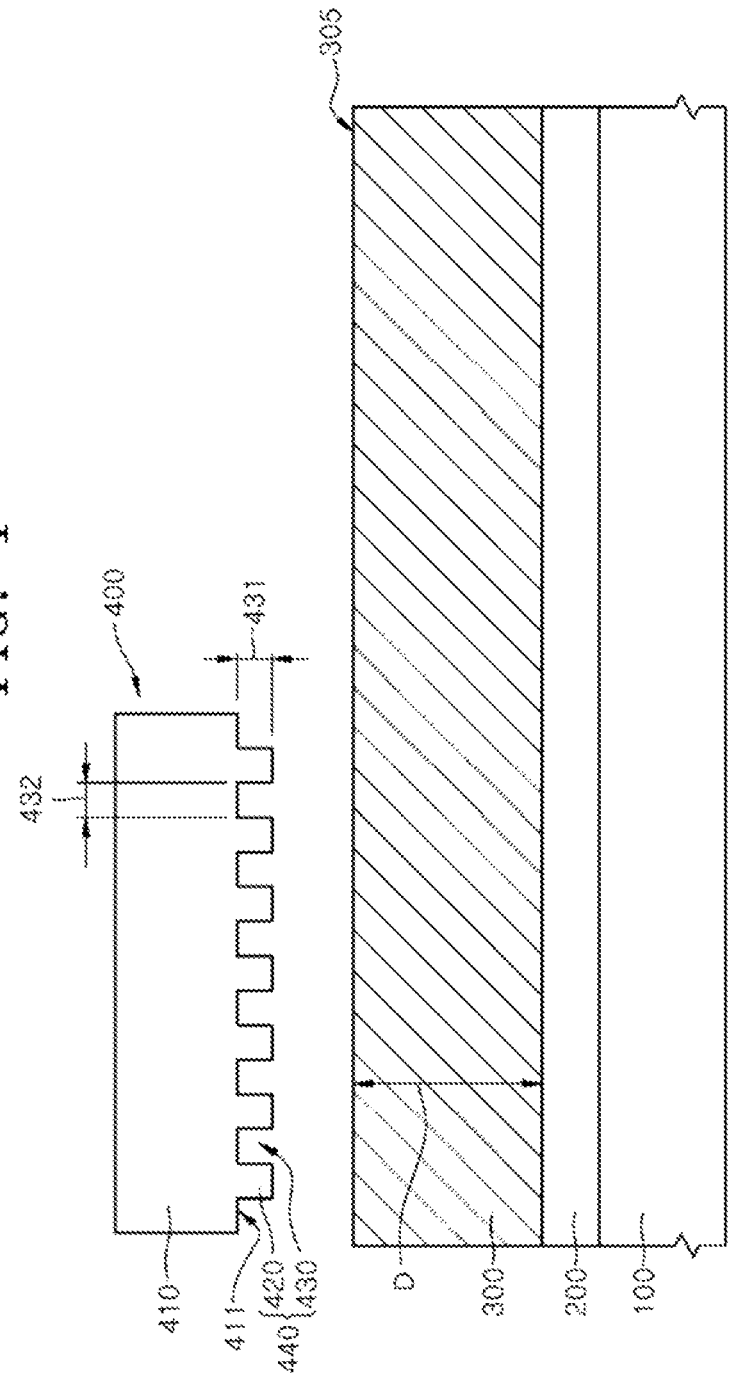
FIGS. 1 to 7 are cross-sectional views illustrating a method for forming patterns according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions.

Unless otherwise defined, the terms used herein have the same meaning as commonly understood by one of ordinary skill in the art to which the embodiments belong.

It will be understood that although the terms first, second, third, top, bottom, upper, lower etc. may be used herein to describe various elements, these elements should not be limited by these terms. These terms are only used to distinguish one element from another element, but not used to define only the element itself or to mean a particular sequence. Thus, a first element in some embodiments could be termed a second element in other embodiments without departing from the teachings of the inventive concept.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion for example, "between" versus "directly between" or "adjacent" versus "directly adjacent".

The following embodiments may be applied to realization of integrated circuits such as dynamic random access memory (DRAM) devices, phase change random access memory (PcRAM) devices or resistive random access memory (ReRAM) devices. Moreover, the following embodiments may be applied to realization of memory devices such as static random access memory (SRAM) devices, flash memory devices, magnetic random access memory (MRAM) devices or ferroelectric random access memory (FeRAM) devices. Furthermore, the following embodiments may be applied to realization of logic devices in which logic circuits are integrated.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

FIG. 1 illustrates a step of forming a resist layer 300 on a substrate 100.

Referring to FIG. 1, the resist layer 300 may be formed on the substrate 100. An underlying layer 200 may be additionally formed on the substrate 100 before the resist layer 300 is formed. The underlying layer 200 may be a layer to which pattern images are transferred in a subsequent process. That is, the underlying layer 200 may be patterned in a subsequent process to obtain the actual patterns. The underlying layer 200 may be patterned in a subsequent process to provide a hard mask pattern. The underlying layer 200 may include an amorphous carbon layer. The underlying layer 200 may further include a capping layer formed on the amorphous carbon layer. The capping layer of the underlying layer 200 may include a silicon oxynitride (SiON) layer.

The resist layer 300 may be formed of an imprintable medium having a surface 305 on which transfer patterns 440 defined by a patterned surface 411 of a template 400 are imprinted. The resist layer 300 may include a polymer material or a resin material. The resist layer 300 may be formed of a curable layer. The resist layer 300 may be formed of a resin material containing a photosensitive component, for example, a photosensitive resin material so that the resist layer 300 can be cured by irradiation of an exposure light such as an ultraviolet (UV) ray. The resist layer 300 may be formed of a photosensitive material.

The resist layer 300 may be formed by coating an imprintable medium on the underlying layer 200 using a spin coating process. Since the resist layer 300 is formed on the substrate 100 or the underlying layer 200 using a spin coating process, it may be possible to apply a step-and-repeat imprint lithography process to the resist layer 300. The step-and-repeat imprint lithography process may be performed by sequentially and repeatedly applying a plurality of imprint shot operations to a plurality of different regions of the resist layer 300. The step of spin-coating the resist layer 300 and the step of repeatedly performing the imprint shot operation may be executed separately. Thus, a process time for repeatedly performing the imprint shot operation may be reduced.

The template 400 may be provided to imprint certain patterns on the resist layer 300. The template 400 may include transfer patterns 440 which are nano-structures to be transferred to the resist layer 300. The template 400 may be a member which is known as a stamp or a mold. The template 400 may be comprised of a transparent material, for example, a silicon material so that exposure light penetrates the template 400. While the transfer patterns 440 of the template 400 contact the surface 305 of the resist layer 300 to perform an imprint process, the exposure light may penetrate the template 400 to reach the resist layer 300.

The transfer patterns 440 defined by the patterned surface 411 of the template 400 may include convex patterns 420 protruding from a body 410 and concave patterns 430 corresponding to empty spaces between the convex patterns 420. Accordingly, the convex patterns 420 and the concave patterns 430 may provide a surface having a concavo-convex shape. Each of the convex patterns 420 may be provided to have a height 431 corresponding to a depth of the concave patterns 430, and each of the concave patterns 430 may be provided to have a width 432 corresponding to a distance between two adjacent ones of the convex patterns 420. During the imprint process, the empty spaces defined by the concave patterns 430 may be filled with the resist layer 300. In order to fully fill the empty spaces defined by the concave patterns 430 with the resist layer 300, an aspect ratio of the concave patterns 430 defined as a ratio of the depth 431 to the width 432 of the concave patterns 430 may be limited. The height 431 of the convex patterns 420 may be less than a thickness D of the resist layer 300, and imprinted patterns may be formed in the resist layer 300 to be adjacent to the surface 305 of the resist layer 300 during the imprint process.

Figure 2:
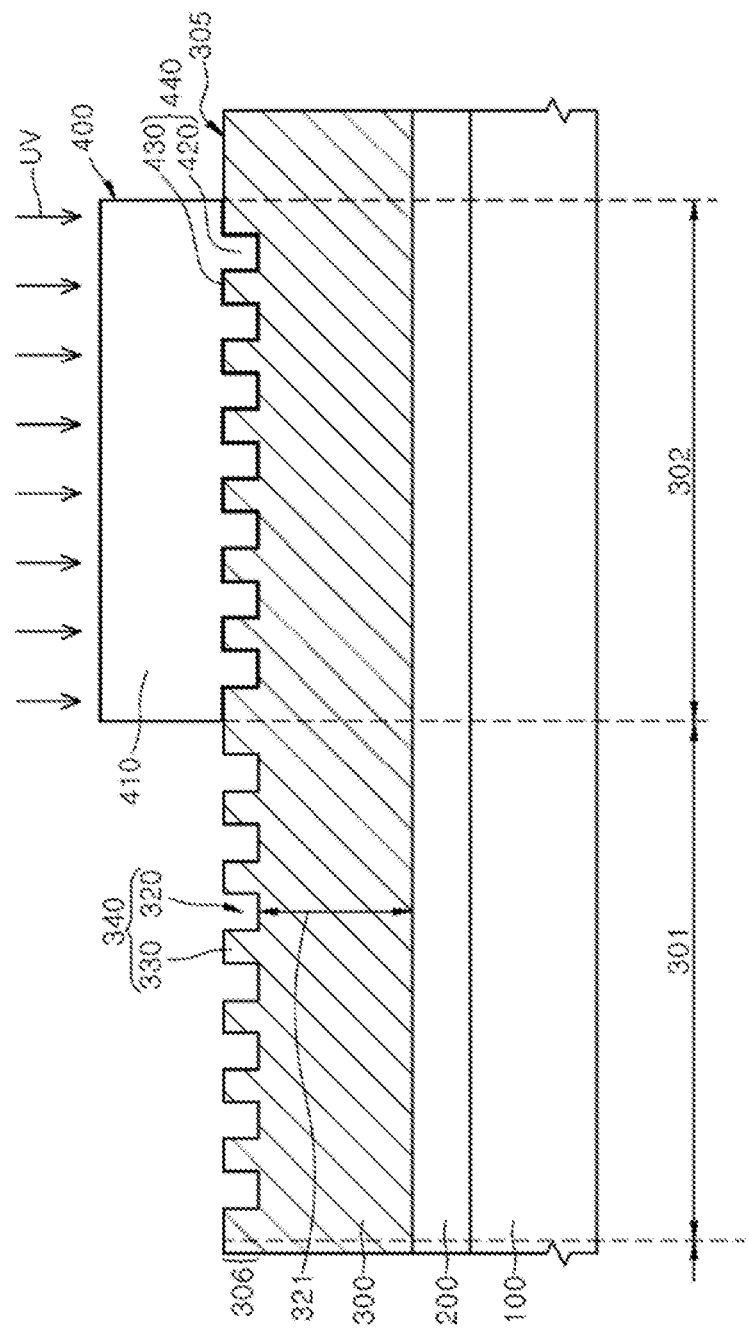

FIG. 2 illustrates a step of forming imprinted patterns 340 in the resist layer 300.

Referring to FIGS. 1 and 2, the template 400 may be aligned with a first pattern region 301 of the resist layer 300, and the template 400 may move down so that the transfer patterns 440 contact the surface 305 of the resist layer 300. Subsequently, the template 400 may be pressed down to insert or embed the transfer patterns 440 into the resist layer 300. The template 400 may be pressed down until the empty spaces of the concave patterns 430 are fully filled with the resist layer 300. As a result, features of the transfer patterns 440 may be imprinted on the resist layer 300.

After the empty spaces of the concave patterns 430 are fully filled with the resist layer 300, exposure light such as UV rays may be irradiated onto the first pattern region 301 of the resist layer 300 to cure the first pattern region 301 of the resist layer 300. When the first pattern region 301 of the resist layer 300 is cured, the imprinted patterns 340 corresponding to the transfer patterns 440 may be formed in the first pattern region 301 of the resist layer 300. The imprinted patterns 340 may be formed to have reversed images of the transfer patterns 440. That is, the imprinted patterns 340 may be formed to include convex patterns 330 corresponding to the concave patterns 430 of the transfer patterns 440 and concave patterns 320 corresponding to the convex patterns 420 of the transfer patterns 440.

After the first pattern region 301 of the resist layer 300 is cured to form the imprinted patterns 340, the template 400 may be detached from the first pattern region 301 of the resist layer 300. After the template 400 is lifted up to detach the transfer patterns 440 of the template 400 from the resist layer 300, the template 400 may move onto the second pattern region 302. This imprint process for the second pattern region 302 may be performed by applying a first imprint shot operation to the first pattern region 301 corresponding to a first imprint shot region. The second pattern region 302 may correspond to a second imprint shot region which is adjacent to the first pattern region 301, and the transfer patterns 440 of the template 400 may be transferred to the second pattern region 302 by a second imprint shot operation. As such, the imprint shot operation for a subsequent pattern region may be sequentially and repeatedly applied to an entire region of the resist layer 300 to form the imprinted patterns 340 on an entire portion of the resist layer 300.

Referring again to FIG. 2, the depth 431 of the concave patterns 430 of the transfer patterns 440 included in the template 400, that is, the height 431 of the convex patterns 420 may be less than the thickness D of the resist layer 300. In such a case, even though the template 400 is pressed down to insert or embed the transfer patterns 440 into the resist layer 300, the resist layer 300 may act as a buffer layer to suppress or prevent the template 400 from being damaged by particles or the like existing on the surface 305 of the resist layer 300.

The imprinted patterns 340 transferred by the imprint shot operations may be formed in a surface layer 306. That is, residue portions 321 of the resist layer 300 may exist under the concave patterns 320 of the imprinted patterns 340, respectively. The residue portions 321 of the resist layer 300 may be selectively removed to form through patterns penetrating the resist layer 300 in a subsequent process. Since the imprinted patterns 340 are formed in the surface layer 306, the imprinted patterns 340 that is, the convex patterns 330, may be comprised of substantially the same resist material as the residue portions 321 of the resist layer 300. Thus, it may be difficult to obtain an etch selectivity of the residue portions 321 with respect to the convex patterns 330.

Figure 3:
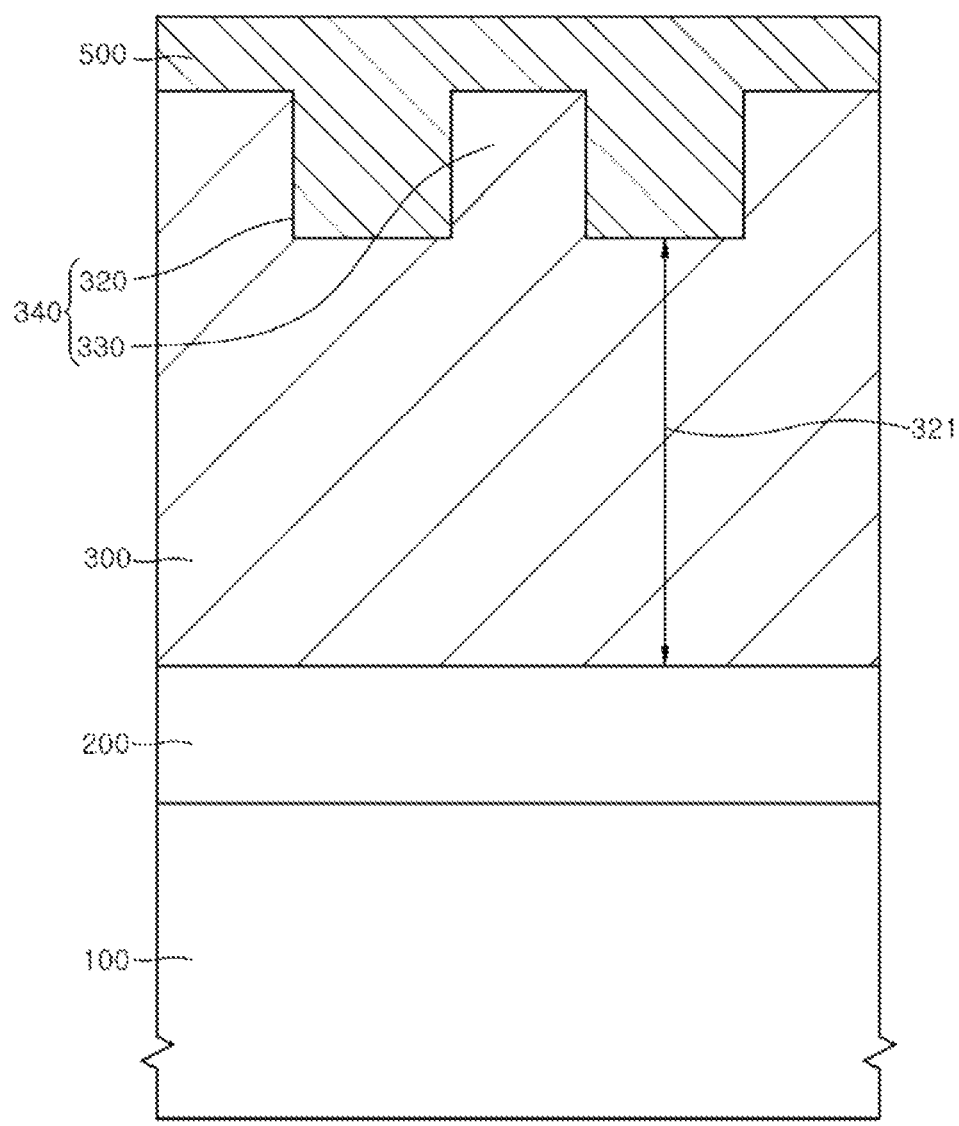

FIG. 3 illustrates a step of forming a buffer layer 500 on the resist layer 300 including the imprinted patterns 340. FIG. 3 is an enlarged view illustrating a portion of the resist layer 300 including the imprinted patterns 340 shown in FIG. 2.

Referring to FIG. 3, the buffer layer 500 may be formed on the resist layer 300 including the imprinted patterns 340 to fill the empty spaces defined by the concave patterns 320 of the imprinted patterns 340. The buffer layer 500 may be formed to cover the convex patterns 330. Since the buffer layer 500 is formed to fill the empty spaces defined by the concave patterns 320, the residue portions 321 under the concave patterns 320 may be covered with the buffer layer 500 after the buffer layer 500 is formed. The buffer layer 500 may include free volume portions therein. Thus, diffusion species such as silicon containing molecules may penetrate the buffer layer 500.

The buffer layer 500 may include a polymeric material which is different from the resist layer 300. The buffer layer 500 may include a silicon-free polymeric material. The buffer layer 500 may be formed to include a polymeric material which is immiscible with the cured resist layer 300. The buffer layer 500 may be formed of a polymeric material which can be dissolved by a solvent that does not dissolve the cured resist layer 300. The buffer layer 500 may be coated on the cured resist layer 300 using a spin-coating process.

The buffer layer 500 may be formed to include a polymeric material which is dissolvable by a developing solution. In such a case, the developing solution may be a solvent including a tetra-methyl-ammonium hydride (TMAH) material. In order to form the buffer layer 500, a solution may be provided by dissolving a solute material of the buffer layer 500 in a solvent. The solution may be coated on the cured resist layer 300 to form the buffer layer 500. In such a case, the cured resist layer 300 may not be dissolved by the solvent constituting the buffer layer 500. In addition, the polymeric material of the buffer layer 500 may not be dissolved by water.

The buffer layer 500 may be formed to act as a top coat material layer. The top coat material layer may be used as a material which is coated on a photoresist layer in an argon fluoride (ArF) immersion lithography technique. The top coat material layer is known as a polymeric material which is coated on a photoresist layer in an immersion lithography technique.

The buffer layer 500 may be formed by spin-coating the solution including the solvent in which the top coat material is dissolved and by baking the coated solution. The baking process may be performed at a temperature of about 100 degrees Celsius, and the solvent in the coated solution may be evaporated and removed during the baking process. While the baking process is performed, the solvent in the coated solution is evaporated and removed to generate free volume portions in the buffer layer 500. The free volume portions in the buffer layer 500 may act as paths through which diffusion species such as silicon containing molecules pass in a subsequent process.

Figure 4:
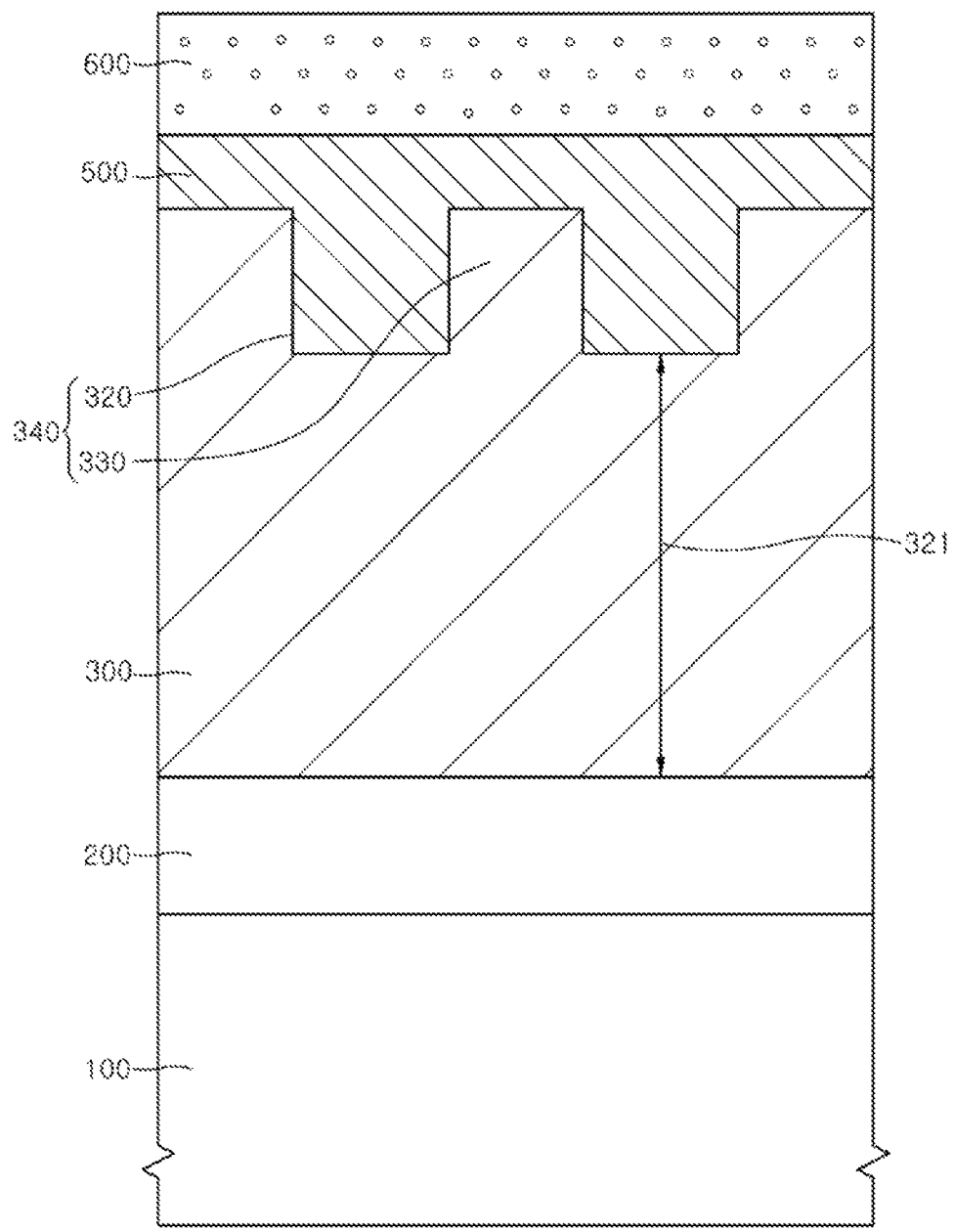

FIG. 4 illustrates a step of forming a silicon source layer 600 on the buffer layer 500.

Referring to FIG. 4, the silicon source layer 600 containing a silicon component may be formed on the buffer layer 500. The silicon source layer 600 may be formed by preparing a solution comprised of a solvent and polymer molecules containing silicon dissolved in the solvent and by coating the solution on the buffer layer 500. The solution may be coated on the buffer layer 500 using a spin-coating process. Since the buffer layer 500 has substantially a flat top surface, the silicon source layer 600 may also be formed to have a flat top surface. In such a case, the solvent for forming the silicon source layer 600 may include water or alcohol as a main component thereof.

The silicon containing polymer molecules may be comprised of any one selected from the group consisting of various polymeric materials containing a silicon component. The silicon containing polymeric material may be a polymeric material having a unit structure of a compound material including a silicon atom and an oxygen atom bonded to the silicon atom. The silicon containing polymeric material may include a material which is known as a dry development rinse material (DDRM). The silicon containing polymeric material may be comprised of a polymeric material having a unit structure which is expressed by a following chemical equation 1, a polymeric material having a unit structure which is expressed by a following chemical equation 2, or a polymeric material having the unit structures which are expressed by the following chemical equations 1 and 2:

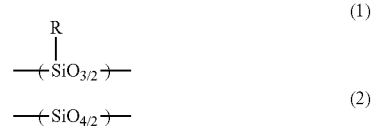

In the chemical equation 1, "R" denotes an organofunctional group bonded to a silicon atom. The organofunctional group may be a methyl group, an ethyl group, a vinyl group, an epoxy group or a phenyl group. In the chemical equation 1, the unit structure of the polymeric material may include a silicon atom (Si), an oxygen atom (O) bonded to the silicon atom (Si), and an organofunctional group (R) bonded to the silicon atom (Si). The polymeric material of the silicon source layer 600 may have a mean molecular weight of about 300 to about 3000.

In some other embodiments, the silicon source layer 600 may be formed to include silicon containing molecules or a silicon containing compound material, other than the silicon containing polymeric material. The silicon containing polymeric material, the silicon containing molecules or the silicon containing compound material dispersed in the silicon source layer 600 may correspond to diffusion species which are diffused into the buffer layer 500 contacting the silicon source layer 600 or into the resist layer 300 under the buffer layer 500.

Figure 5:
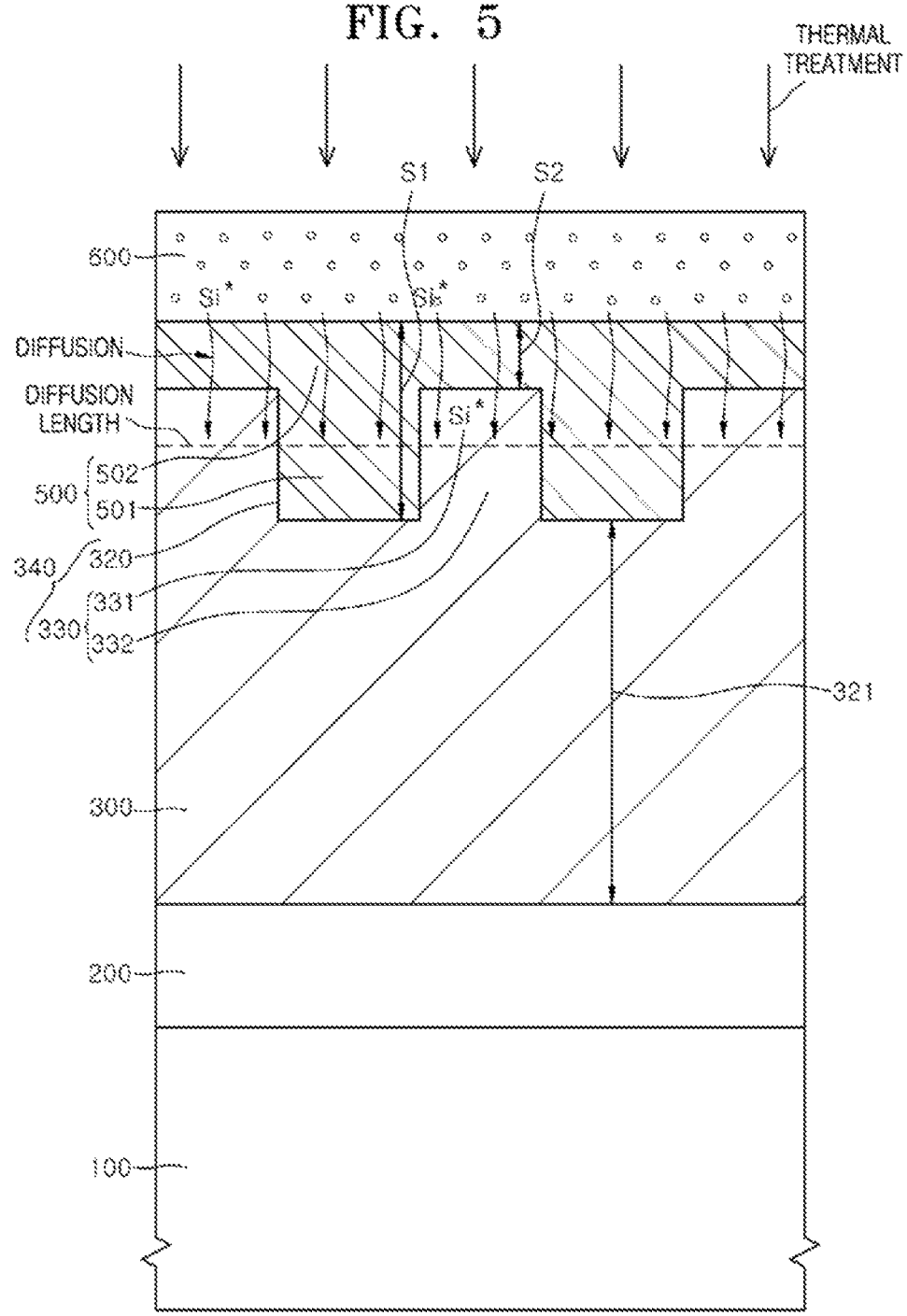

FIG. 5 illustrates a step of forming a silicon diffusion layer 331 in the convex patterns 330 of the imprinted patterns 340.

Referring to FIG. 5, the silicon source layer 600 may be thermally annealed or treated to diffuse the diffusion species Si* such as silicon containing polymer molecules in the silicon source layer 600 into the cured resist layer 300. During the annealing process that is, the thermal treatment process, the silicon containing polymer molecules in the silicon source layer 600 may be diffused to penetrate the buffer layer 500. During the annealing process, the silicon containing polymer molecules in the silicon source layer 600 may penetrate the buffer layer 500 to be additionally diffused into upper portions of the convex patterns 330 of the imprinted patterns 340 contacting the buffer layer 500.

A diffusion length of the silicon containing polymer molecules may be uniform from a surface of the silicon source layer 600. The diffusion length of the silicon containing polymer molecules may be controlled so that the silicon containing polymer molecules are not diffused into the residue portions 321 under the concave patterns 320. For example, the annealing process may be controlled by varying an annealing time or an annealing temperature so that the silicon containing polymer molecules in the silicon source layer 600 are not diffused into the residue portions 321 but diffused into the convex patterns 330.

The buffer layer 500 may separate the silicon source layer 600 from the residue portions 321 of the resist layer 300. First portions of the buffer layer 500 filling the empty spaces of the concave patterns 320 of the imprinted patterns 340 may have a first thickness S1, and second portions of the buffer layer 500 located between the silicon source layer 600 and the convex patterns 330 of the imprinted patterns 340 may have a second thickness S2 which is less than the first thickness S1. Thus, the silicon containing polymer molecules in the silicon source layer 600 may be selectively diffused into the convex patterns 330 using a thickness difference between the first and second thicknesses S1 and S2, while the silicon containing polymer molecules in the silicon source layer 600 are not diffused into the residue portions 321 of the resist layer 300.

As described above, the diffusion species Si* containing silicon may penetrate the buffer layer 500 to reach the upper portions of the convex patterns 330 during the annealing process. The buffer layer 500 may fill the empty spaces of the concave patterns 320 to prevent diffusion species Si* in the silicon source layer 600 from being diffused into the residue portions 321 of the resist layer 300.

Since the silicon source layer 600 is spaced apart from the residue portions 321 of the resist layer 300 by the buffer layer 500 by a distance corresponding to the first thickness S1, the diffusion species Si* In the silicon source layer 600 may not be diffused into the residue portions 321 of the resist layer 300 by controlling the diffusion length of the diffusion species Si* in the silicon source layer 600. As a result, after the annealing process, first regions 501 of the buffer layer 500 on the residue portions 321 of the resist layer 300 may not contain the diffusion species Si* such as silicon containing polymer molecules and second regions 502 of the buffer layer 500 on the first regions 501 of the buffer layer 500 may contain the diffusion species Si* such as silicon containing polymer molecules.

While the annealing process is performed, the upper portions of the convex patterns 330 of the imprinted patterns 340 may be doped with the diffusion species Si* to provide the silicon diffusion layer 331. Thus, the silicon diffusion layer 331 may correspond to a layer including a resist material and silicon containing polymer molecules diffused into the resist material. Lower portions of the convex patterns 330 under the silicon diffusion layer 331 may still remain as a resist layer without including the diffusion species Si*.

In order to selectively form the silicon diffusion layer 331 in the upper portions of the convex patterns 330, the annealing process may be performed to bake the silicon source layer 600 at a temperature of about 80 degrees Celsius to about 130 degrees Celsius. The annealing process for baking the silicon source layer 600 may be performed for about 30 seconds to about 120 seconds. In an embodiment, the silicon source layer 600 may be baked for about 60 seconds at a temperature of about 100 degrees Celsius to prevent the diffusion species Si* that is, the silicon containing polymer molecules, in the silicon source layer 600 from being diffused into the residue portions 321 of the resist layer 300.

The silicon diffusion layer 331 in the upper portions of the convex patterns 330 may be a resist layer containing the diffusion species Si* that is, the silicon containing polymer molecules. Since the silicon diffusion layer 331 is a silicon containing polymeric layer, the silicon diffusion layer 331 may exhibit a relatively low etch rate as compared with the residue portions 321 of the resist layer 300 while an etch process for selectively removing the residue portions 321 of the resist layer 300 is performed. That is, the silicon containing polymer molecules in the silicon diffusion layer 331 may disturb etching the silicon diffusion layer 331 during an etch process for selectively removing the residue portions 321 of the resist layer 300. Accordingly, the silicon diffusion layer 331 may have a high etch selectivity with respect to the residue portions 321 of the resist layer 300.

Figure 6:
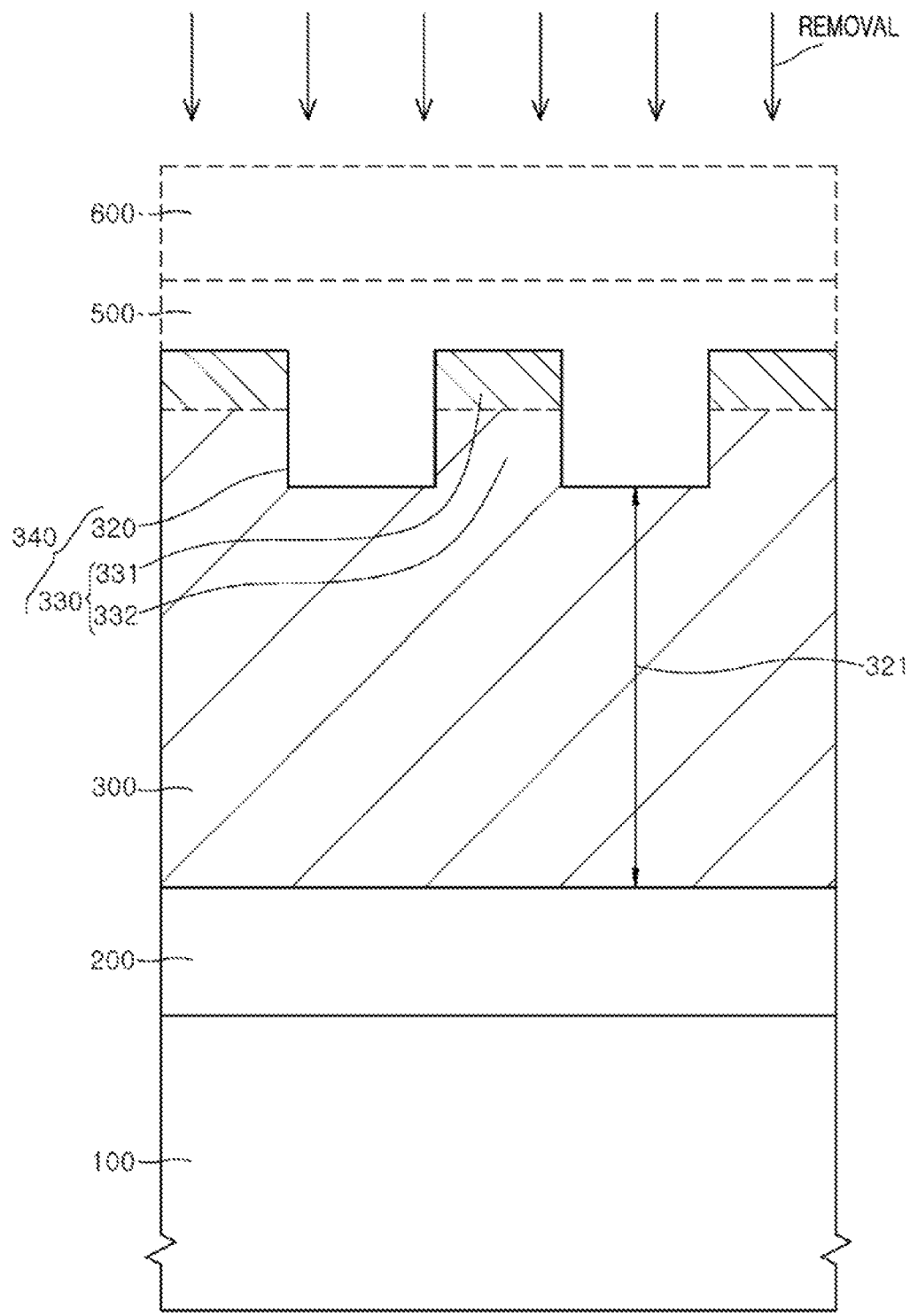

FIG. 6 illustrates a step of selectively removing the silicon source layer 600 and the buffer layer 500.

Referring to FIG. 6, the silicon source layer 600 and the buffer layer 500 may be selectively removed to expose a surface of the cured resist layer 300. The silicon source layer 600 and the buffer layer 500 may be selectively removed using a developing solution, for example, a developer including a TMAH material.

After the silicon source layer 600 and the buffer layer 500 are selectively removed, the cured resist layer 300 may still include the imprinted patterns 340 which are comprised of the convex patterns 330 having the silicon diffusion layer 331 and the concave patterns 320 having recessed shapes between the convex patterns 330. The residue portions 321 of the resist layer 300 may be exposed after the silicon source layer 600 and the buffer layer 500 are selectively removed.

Figure 7:
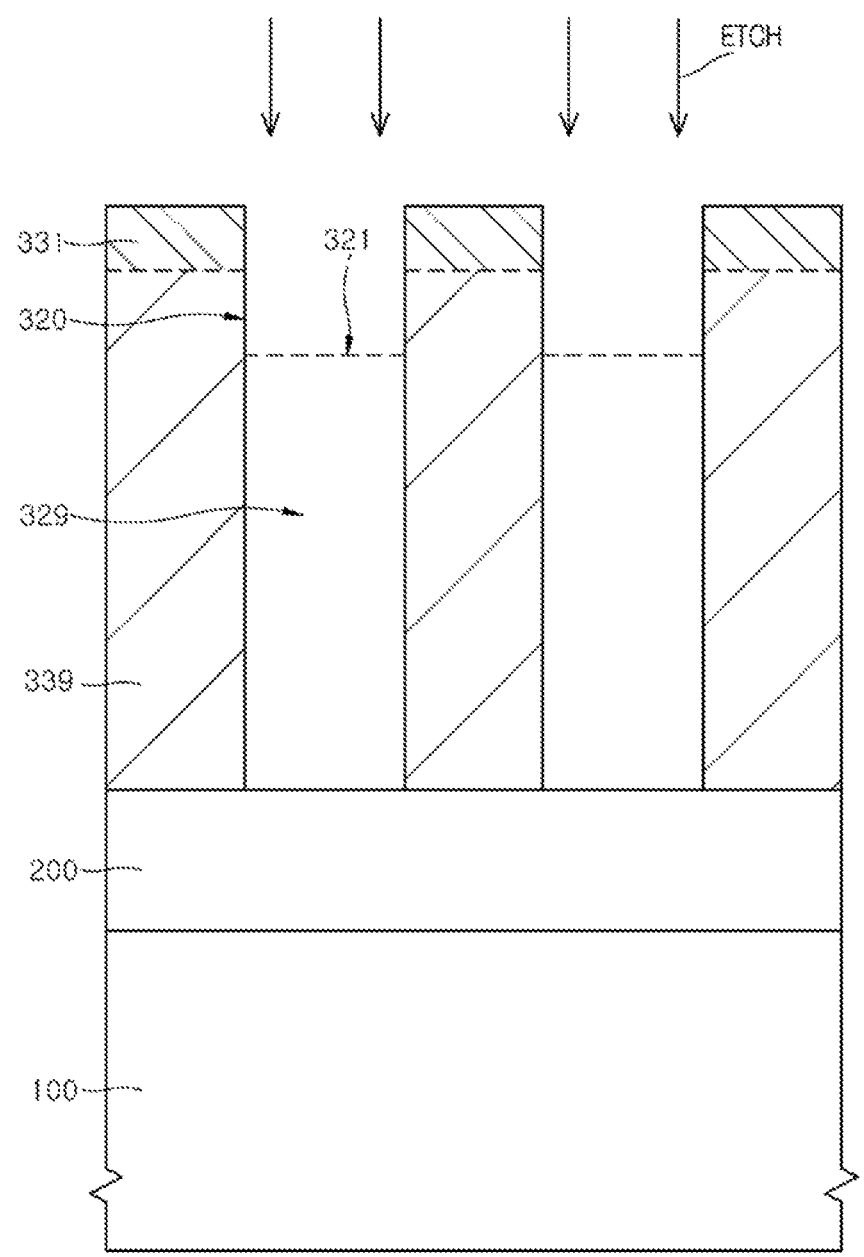

FIG. 7 illustrates a step of selectively removing the residue portions 321 of the resist layer 300 to form a resist pattern 339.

Referring to FIG. 7, the residue portions 321 of the resist layer 300 may be etched using the silicon diffusion layer 331 as an etch mask to selectively remove the residue portions 321 of the resist layer 300. The residue portions 321 under the concave patterns 320 may be exposed by the silicon diffusion layer 331, the exposed residue portions 321 may be selectively etched and removed. The residue portions 321 may be selectively etched using oxygen plasma. A silicon component in the silicon diffusion layer 331 may disturb an etch reaction of the silicon diffusion layer 331 when the silicon diffusion layer 331 is exposed to oxygen plasma. Thus, an etch rate of the silicon diffusion layer 331 may be lower than an etch rate of the residue portions 321 when the silicon diffusion layer 331 and the residue portions 321 are exposed to the oxygen plasma. Accordingly, since the silicon diffusion layer 331 functions as an etch mask or a hard mask while the residue portions 321 are etched, it may be possible to selectively remove the residue portions 321.

When the residue portions 321 are selectively removed, a resist pattern 339 may be formed to have opening portions 329 that expose portions of the underlying layer 200. The resist pattern 339 may be formed to have substantially the same feature as the imprinted patterns 340 formed by the imprint operation, particularly, the same feature as the convex patterns 330 of the imprinted patterns 340.

The resist pattern 339 may be used as an etch mask in a subsequent process for etching the underlying layer 200.

According to the embodiments described above, nano-scale structures or nano structures can be fabricated on a large-sized substrate. The nano structures may be used in fabrication of polarizing plates or in formation of a reflective lens of reflective liquid crystal display (LCD) units. The nano structures may also be used in fabrication of separate polarizing plates as well as in formation of polarizing parts including display panels. For example, the nano structures may be used in fabrication of array substrates including thin film transistors or in processes for directly forming the polarizing to parts on color filter substrates. Further, the nano structures may be used in molding processes for fabricating nanowire transistors or memories, molding processes for fabricating electronic/electric components such as nano-scaled interconnections, a molding process for fabricating catalysts of solar cells and fuel cells, a molding process for fabricating etch masks and organic light emitting diodes (OLEDs), and a molding process for fabricating gas sensors.

The methods according to the aforementioned embodiments and structures formed thereby may be used in fabrication of integrated circuit (IC) chips. The IC chips may be supplied to users in a raw wafer form, in a bare die form or in a package form. The IC chips may also be supplied in a single chip package form or in a multi-chip package form. The IC chips may be integrated in intermediate products such as mother boards or end products to constitute signal processing devices. The end products may include toys, low end application products, or high end application products such as computers. For example, the end products may include display units, keyboards, or central processing units (CPUs).

The embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A method for forming patterns, the method comprising:
   forming a resist layer on a substrate;
   imprinting a convex pattern and a concave pattern on the resist layer using a template;
   forming a silicon free buffer layer on the resist layer to fill the concave pattern;
   forming a silicon source layer on the buffer layer;
   diffusing silicon containing diffusion species in the silicon source layer into an upper portion of the convex pattern to form a silicon diffusion layer;
   selectively removing the silicon source layer and the buffer layer; and
   selectively removing a recessed portion of the resist layer under the concave pattern using the silicon diffusion layer as an etch mask,
   wherein the buffer layer separates the silicon source layer from the resist layer.

2. The method of claim 1, wherein the buffer layer includes a silicon free polymeric material which is immiscible with the resist layer.

3. The method of claim 2, wherein the forming of the buffer layer includes:
   preparing a solution;
   coating the solution on the resist layer using a spin-coating process; and
   evaporating a solvent contained in the coated solution.

4. The method of claim 1, wherein the buffer layer is formed to cover the convex pattern.

5. The method of claim 1, wherein the buffer layer is formed to provide a flat surface of the silicon source layer.

6. The method of claim 1, wherein the silicon source layer includes silicon containing polymer molecules that function as the silicon containing diffusion species.

7. The method of claim 6, wherein each of the silicon containing polymer molecules has a unit structure including a silicon atom and an oxygen atom bonded to the silicon atom.

8. The method of claim 1,
   wherein the silicon source layer is formed by spin-coating a silicon containing solution on the buffer layer; and
   wherein the silicon containing solution is provided to include silicon containing polymer molecules dissolved in a solvent.

9. The method of claim 1, wherein the diffusing silicon containing diffusion species in the silicon source layer are diffused into the upper portion of the convex pattern using an annealing process performed at a temperature of about 80 degrees Celsius to about 130 degrees Celsius.

10. The method of claim 1, wherein the forming of the resist layer includes spin-coating a photosensitive resist material on the substrate.

11. The method of claim 1, wherein the imprinting of the convex pattern and the concave pattern includes:
    pressing down a transfer pattern of the template into the resist layer to form the convex pattern and the concave pattern; and
    irradiating an ultraviolet (UV) ray onto the resist layer to cure the resist layer having the convex pattern and the concave pattern.

12. A method for forming patterns, the method comprising:
    forming a resist layer on a substrate;
    imprinting a convex pattern and a concave pattern on the resist layer using a template;
    forming a silicon diffusion layer containing silicon containing diffusion species in an upper portion of the convex pattern; and
    selectively removing a recessed portion of the resist layer under the concave pattern using the silicon diffusion layer as an etch mask,
    wherein the silicon diffusion layer exposes the recessed portion of the resist layer.

13. The method of claim 12, further comprising forming a buffer layer that substantially prevents the silicon containing diffusion species from being diffused into the recessed portion of the resist layer.

14. The method of claim 13, wherein the buffer layer includes a silicon free polymeric material which is immiscible with the resist layer.

15. The method of claim 14, wherein the forming of the buffer layer includes:
    preparing a solution;

coating the solution on the resist layer using a spin-coating process; and evaporating a solvent contained in the coated solution.

16. The method of claim 15, wherein the buffer layer is formed to cover the convex pattern.

17. The method of claim 16, wherein the forming of the silicon diffusion layer includes diffusing the silicon containing diffusion species so that the silicon containing diffusion species penetrate the buffer layer to reach the upper portion of the convex pattern.

18. The method of claim 12, wherein the forming of the resist layer includes spin-coating a photosensitive resist material on the substrate.

19. The method of claim 12, wherein the imprinting of the convex pattern and the concave pattern includes:

pressing down a transfer pattern of the template into the resist layer to form the convex pattern and the concave pattern; and irradiating an ultraviolet (UV) ray onto the resist layer to cure the resist layer having the convex pattern and the concave pattern.

* * * * *